US 6,747,398 B2

(12) United States Patent
Nakatani

(10) Patent No.: US 6,747,398 B2
(45) Date of Patent: Jun. 8, 2004

(54) MULTILAYER PIEZOELECTRIC DEVICE AND PIEZOELECTRIC ACTUATOR FORMED USING THE SAME

(75) Inventor: Hiroshi Nakatani, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 139 days.

(21) Appl. No.: 10/179,236

(22) Filed: Jun. 26, 2002

(65) Prior Publication Data

US 2003/0020371 A1 Jan. 30, 2003

(30) Foreign Application Priority Data

Jul. 25, 2001 (JP) ........................................ 2001-224510

(51) Int. Cl.[7] .............................................. H01L 41/08
(52) U.S. Cl. ........................ 310/328; 310/366; 347/70
(58) Field of Search ........................ 310/328, 330–332, 310/358, 359, 366; 347/68–72

(56) References Cited

U.S. PATENT DOCUMENTS

| | | | | |
|---|---|---|---|---|
| 5,793,149 A | * | 8/1998 | Thiel et al. | 310/328 |
| 5,945,773 A | * | 8/1999 | Nagashima | 310/328 |
| 6,398,350 B2 | * | 6/2002 | Kitahara | 347/70 |
| 6,623,111 B2 | * | 9/2003 | Nakatani | 347/72 |

FOREIGN PATENT DOCUMENTS

JP  11-10875  1/1999

* cited by examiner

Primary Examiner—Mark Budd
(74) Attorney, Agent, or Firm—Keating & Bennett, LLP

(57) ABSTRACT

A multilayer piezoelectric device includes long internal electrodes and short internal electrodes which are arranged so as to extend from a pair of opposing side surfaces of a piezoelectric substrate towards the corresponding side surfaces opposite to the side surfaces from which they extend, and so as to be alternately stacked in the piezoelectric substrate. Active portions are located at portions where the long internal electrodes and the corresponding short internal electrodes are stacked. Further, a first external electrode, connected to the short internal electrodes, is electrically connected to the side surface near the active portions, and a second external electrode, connected to the long internal electrodes, is electrically connected to the side surface distant from the active portions. The first external electrode extends from the side surface of the piezoelectric substrate near the active portions, onto a main surface, and to a location adjacent to the side surface distant from the active portions, while the second external electrode extends onto the main surface so as to be disposed on left and right sides of locations at the first external electrode that are adjacent to the side surface of the piezoelectric substrate distant from the active portions.

14 Claims, 9 Drawing Sheets

MULTILAYER PIEZOELECTRIC DEVICE AND PIEZOELECTRIC ACTUATOR FORMED USING THE SAME

BACKGROUND OF THE INVENTION

1. Field of the Invention

The present invention relates to a multilayer piezoelectric device and a piezoelectric actuator including such a multilayer piezoelectric device.

2. Description of the Related Art

In general, a piezoelectric actuator which makes use of a piezoelectric effect is sometimes used in a print head of an inkjet printer. As shown in FIG. 8, a piezoelectric actuator $1_o$ has a piezoelectric property which causes it to be displaced in what is called a d31 direction, that is, a direction that is perpendicular to the thickness direction of a piezoelectric device. A portion of the bottom surface of the piezoelectric actuator $1_o$ is adhered to a fixation substrate 2, and a pressure-generating chamber 3 is disposed in contact with the end portion of the piezoelectric actuator $1_o$ that is not adhered to the fixation substrate 2. One end of a signal-inputting flexible printed circuit board (hereinafter referred to as "FPC") 4 is connected to the top surface of the piezoelectric actuator $1_o$. Accordingly, when a signal is input from the FPC 4, the piezoelectric actuator $1_o$ is displaced in a direction that is perpendicular to the thickness direction thereof, causing pressure to be exerted onto ink inside the pressure-generating chamber 3, so that the ink is discharged outside the pressure-generating chamber 3.

The structure shown in FIGS. 9 and 10 has been known as a structure of a multilayer piezoelectric device $6_o$ included in a piezoelectric actuator $1_o$. (For example, refer to Japanese Unexamined Patent Application Publication No. 11-10875.)

More specifically, the related multilayer piezoelectric device $6_o$ includes a rectangular piezoelectric substrate 7. Short internal electrodes 8 and long internal electrodes 9, having different lengths, are arranged so that the short internal electrodes 8 extend from a side surface 7b towards an opposite side surface 7c and the long internal electrodes extend from the side surface 7c to the opposite side surface 7b. In addition, the short internal electrodes 8 and the long internal electrodes 9 are alternately stacked in the piezoelectric substrate 7. The side surfaces 7b and 7c are opposite each other in the direction of a short side of the piezoelectric substrate 7. In other words, in the direction of a long side (longitudinal side) of the piezoelectric substrate 7, the electrodes 8 and 9 have lengths that are substantially equal to the overall width of the piezoelectric substrate 7. On the other hand, in the direction of a short side of the piezoelectric substrate 7, the short internal electrodes 8 are shorter than the long internal electrodes 9. Active portions 10 which are displaced in a direction that is perpendicular to the lamination direction are located at the portions where the electrodes 8 and the corresponding electrodes 9 overlap. Therefore, as shown in FIG. 10, the active portions 10 are adjacent to the left side surface 7b of the two side surfaces 7b and 7c that are opposite each other in the direction of a short side of the piezoelectric substrate 7, and have shapes that are asymmetrical in the horizontal direction.

Each of the short internal electrodes 8 is in a drawn-out state at the side surface 7b of the piezoelectric substrate 7 near the active portions 10, and each of the long internal electrodes 9 is in a drawn-out state at the side surface 7c of the piezoelectric substrate 7 distant from the active portions 10. A first external electrode $13_o$ and a second external electrode $14_o$ are electrically connected to the drawn-out short internal electrodes 8 and the drawn-out long internal electrodes 9, respectively.

The first external electrode $13_o$ extends from the side surface 7b of the piezoelectric substrate 7 near the active portions 10 towards the side surface 7c and distant from the active portions 10 by extending onto a main surface 7a, and terminates before reaching the side surface 7c. On the other hand, the second external electrode $14_o$ extends from the side surface 7c of the piezoelectric substrate 7 and distant from the active portions 10 towards a location which opposes an end portion of the first external electrode $13_o$ at a predetermined interval d therefrom by extending onto the main surface 7a. The certain interval d between the first and second external electrodes $13_o$ and $14_o$ is provided because it is necessary to electrically isolate them.

As described later, when forming the piezoelectric actuator $1_o$ using the multilayer piezoelectric device $6_o$, electrical conductors on the FPC 4 need to be electrically connected to the first and second external electrodes $13_o$ and $14_o$. Therefore, an area which extends a predetermined distance of $L_4$ from the side surface 7c of the piezoelectric substrate 7 and distant from the active portions 10 is provided as a predetermined soldering portion $16_o$ required for soldering.

Such a multilayer piezoelectric device $6_o$ and the piezoelectric actuator $1_o$ including the multilayer piezoelectric device $6_o$, are formed, for example, in the following way.

In order to form the multilayer piezoelectric device $6_o$, as shown in FIG. 11, three types of green sheets 31, 32, and 33 are provided. In other words, there are provided the green sheets 31 which have electrically conductive patterns 41, which define the short internal electrodes 8, disposed thereon. The green sheets 32 which have electrically conductive patterns 42, which define the long internal electrodes 9, disposed thereon, and the green sheets 33 which do not have any electrically conductive patterns formed thereon, are also provided. These green sheets 31, 32, and 33 are produced by forming piezoelectric materials, such as PZT materials, into rectangular shapes in plan view. The electrically conductive patterns 41 and 42 are formed by screen printing electrically conductive paste whose main component is, for example, silver (Ag).

After alternately and sequentially placing upon each other a predetermined number of each of the green sheets 31 and 32 having the corresponding electrically conductive patterns 41 and 42 formed thereon, the green sheets 33 are disposed on the topmost and bottommost portions of the resulting layered structure. Then, all of these sheets 31, 32, and 33 are press-bonded all together along the lamination direction, and baked. After the baking, the first and second external electrodes $13_o$ and $14_o$ are formed by evaporation. Thereafter, by polarizing the piezoelectric substrate 7, the multilayer piezoelectric device $6_o$ including the active portions 10 at the portions where the short internal electrodes 8 and the corresponding long internal electrodes 9 are stacked is produced.

Next, using the multilayer piezoelectric device $6_o$, formed in the above-described manner, the piezoelectric actuator $1_o$ is formed as shown in FIG. 12. First, the multilayer piezoelectric device $6_o$ is adhered to the fixing substrate 2 with an adhesive so that its active portions 10 do not overlap the fixing substrate 2.

Then, using a dicing saw, cuts of predetermined sizes are formed at predetermined pitches along the longitudinal direction of the multilayer piezoelectric device $6_o$ from the side surface 7b towards the side surface 7c in order to form slits 21. As a result, movable portions $22_o$ which can be separately driven are formed between the slits 21. Further, cuts are formed in the first external electrode $13_o$ consecutively with the corresponding slits 21 in order to form shallow grooves 23, so that the first external electrode $13_o$ is electrically isolated from each movable portion $22_o$.

Next, the FPC 4 is soldered onto the predetermined soldering portion $16_o$, so that the electrical conductors on the FPC 4 are electrically connected to each of the divided first external electrode $13_o$ portions and the second external electrode $14_o$. For example, signal-input-side electrical conductors on the FPC 4 are connected to the corresponding divided first external electrode $13_o$ portions, and a ground-side electrical conductor is connected to the second external electrode $14_o$. Pressure-generating chambers 3 are separately disposed at the corresponding movable portions $22_o$ of the piezoelectric actuator $1_o$. Accordingly, by separately inputting signals to each of the divided first external electrode $13_o$ portions, the movable portions $22_o$ are separately driven, so that ink from each of the pressure-generating chambers 3 is separately discharged.

As mentioned above, in the multilayer piezoelectric device $6_o$ included in the piezoelectric actuator $1_o$, it is necessary to electrically connect the FPC 4 to both electrodes $13_o$ and $14_o$ while the end portions of the first and second external electrodes $13_o$ and $14_o$ at the main surface 7a oppose each other at the predetermined distance d from each other. Therefore, in the related multilayer piezoelectric device $6_o$, a relatively large length $L_4$ extending from the side surface 7c of the piezoelectric substrate 7 and distant from the active portions 10 is required as the predetermined soldering portion $16_o$. As a result, the predetermined soldering portion $16_o$ is disposed close to the active portions 10.

In producing the piezoelectric actuator $1_o$, when the FPC 4 is soldered onto the predetermined soldering portion $16_o$, the FPC soldering location is close to the active portions 10, so that, not only is smooth expansion and contraction of each of the movable portions $22_o$ prevented, but also the following problems arise due to transmission of vibration, produced by displacement of the movable portions $22_o$, to other portions through the FPC 4.

More specifically, when a signal Vp having an applied voltage waveform such as that represented by waveform a of FIG. 13 is input to a predetermined movable portion $22_o$ for a period of time of $t_1$ to $t_2$, if the FPC-4-soldering location is sufficiently separated from the active portion 10, the vibration is damped within a short period of time, as shown by waveform b of FIG. 13. In contrast, when the FPC-soldering location is close to the active portion 10, the vibration damping time becomes longer, as shown by waveform c of FIG. 13. As a result of this, ink discharge becomes unstable, thereby causing reduced image quality.

In addition, when the soldering location is close to the active portion 10, the active portion 10 loses its polarization property because it is affected by heat produced during soldering, thereby causing, for example, the problem that active portion 10 becomes unable function piezoelectrically.

To solve these problems, the predetermined soldering portion $16_o$ may be moved further away from the locations of the active portions 10 by, for example, making long a distance $L_5$ from the side surface 7b of the piezoelectric substrate 7 near the active portions 10 to the predetermined soldering portion $16_o$ in the multilayer piezoelectric device $6_o$. However, when this is done, an overall length $L_3$ of the piezoelectric substrate 7 in the direction of a short side thereof becomes long so that, not only is it impossible to reduce the size of the entire multilayer piezoelectric device $6_o$, but also, for example, costs of the multilayer piezoelectric device $6_o$ are increased. Therefore, it is not advisable to make the overall length $L_3$ long.

SUMMARY OF THE INVENTION

In order to overcome the above-described problems, preferred embodiments of the present invention provide a multilayer piezoelectric device which is greatly reduced in size and which has an excellent piezoelectric property as a result of making it possible to provide a sufficient distance between an active portion and a soldering location when a piezoelectric actuator is constructed. In addition, other preferred embodiments provide a piezoelectric actuator including such a novel multilayer piezoelectric device.

According to a preferred embodiment of the present invention, a multilayer piezoelectric device including a substantially rectangular piezoelectric substrate, long internal electrodes, and short internal electrodes. The long internal electrodes and the short internal electrodes have different lengths and arranged so that the long internal electrodes and the short internal electrodes extend from a pair of opposing side surfaces of the piezoelectric substrate towards the corresponding side surfaces of the piezoelectric substrate opposite to the side surfaces from which the long internal electrodes and the short internal electrodes extend. The long internal electrodes and the short internal electrodes are also arranged such that the short internal electrodes and the long internal electrodes are alternately stacked inside the piezoelectric substrate. The multilayer piezoelectric device further includes active portions which are disposed at portions where the long internal electrodes and the corresponding short internal electrodes are stacked, and which are displaced in a direction that is substantially perpendicular to a direction in which the long internal electrodes and the corresponding short internal electrodes are stacked, a first external electrode which is electrically connected to the short internal electrodes at the drawn-out side surface, and a second external electrode which is electrically connected to the long internal electrodes at the drawn-out side surface. The first external electrode and the second external electrode are separately formed on a surface of the piezoelectric substrate. In addition, the first external electrode extends from the side surface of the piezoelectric substrate near the active portions, extends onto a main surface, and extends to a location adjacent to the side surface distant from the active portions where the long internal electrodes are drawn out. The second external electrode extends onto the main surface so as to be disposed on left and right sides of locations at the first external electrode that are adjacent to the side surface of the piezoelectric substrate distant from the active portions.

The second external electrode may be arranged so as to extend onto the main surface from the side surface of the piezoelectric substrate distant from the active portions. Alternatively, the second external electrode may be arranged so as to extend onto the main surface from a side surface of the piezoelectric substrate that is substantially perpendicular to the side surface of the piezoelectric substrate distant from the active portions.

According to preferred embodiments of the present invention, unlike a related multilayer piezoelectric device where the end surfaces of the first and second external electrodes are face and oppose each other, the multilayer piezoelectric device of the present invention is constructed so that the second external electrode is disposed on both the left and right sides of locations at the first external electrode that are adjacent to the side surface distant from the active portions. Therefore, it is possible to dispose each of the first and second external electrodes adjacent to the side surface of the piezoelectric substrate and distant from the active portions. Therefore, the location where the FPC is to be soldered no longer needs to be situated very far from the side surface of the piezoelectric substrate distant from the active portions, so that the location where the FPC is to be soldered can be sufficiently separated from the active-portion-formation locations. As a result, comparing the multilayer piezoelectric device of preferred embodiments of the present invention with a related multilayer piezoelectric device, the overall length of the piezoelectric substrate in the direction of a short side thereof can be made shorter. In addition, the entire multilayer piezoelectric device of preferred embodiments of the present invention can be made much smaller than a related multilayer piezoelectric device.

According to another preferred embodiment of the present invention, a piezoelectric actuator wherein, by forming slits, extending from the side surface near the active portions towards the side surface opposite thereto of the multilayer piezoelectric device of any one of the preferred embodiments of the present invention described above, at a predetermined pitch along a direction that is substantially perpendicular to the direction of extension of the slits, separately drivable movable portions are provided between the corresponding slits, and an electrical conductor on a flexible printed circuit board is connected to the first external electrode, divided by the slits, and the second external electrode.

In the piezoelectric actuator, since the FPC-soldering location is disposed away from the active portions, the movable portions expand and contract smoothly, and transmission of vibration, produced by displacement of the movable portions, to other portions through the FPC is reliably prevented. Therefore, vibration is damped within a short period of time, so that ink is stably discharged, thereby providing excellent image quality. In addition, since the soldering portion is disposed away from the active portions, there is no possibility of the polarization properties of the active portions being deteriorated by heat produced during soldering, so that stable piezoelectric properties are provided.

Other features, elements, characteristics and advantages of the present invention will become more apparent from the following detailed description of preferred embodiments thereof with reference to the attached drawings.

DETAILED DESCRIPTION OF PREFERRED EMBODIMENTS

A description of preferred embodiments of the present invention will be given in detail, with reference to the drawings.

Figure 1:
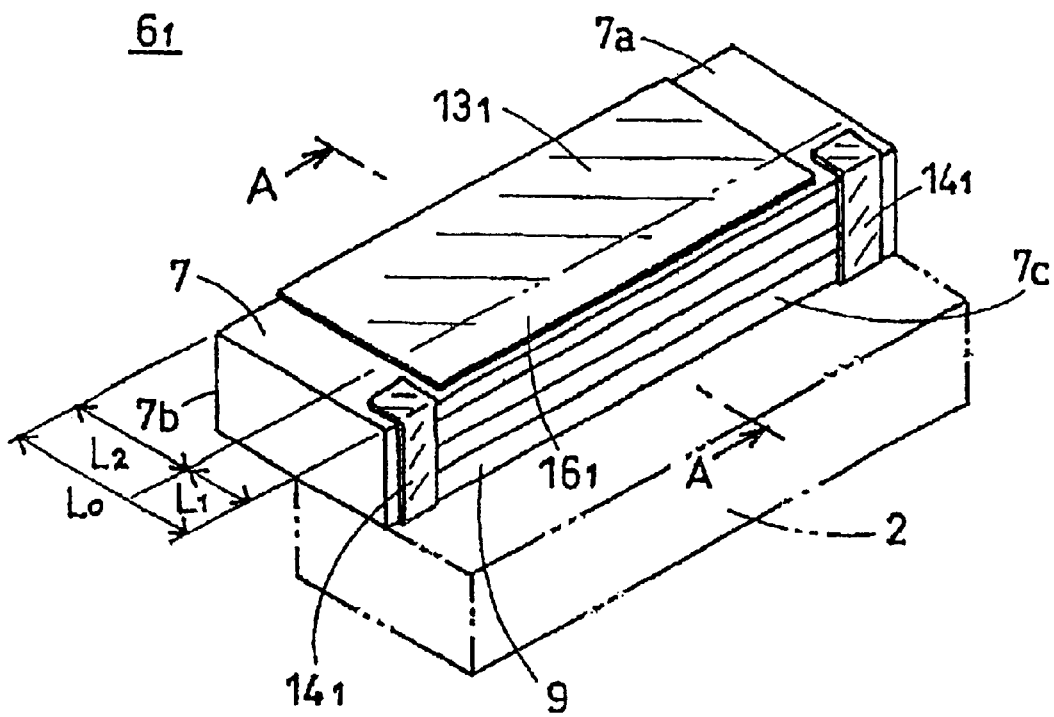
FIG. 1 is a perspective view of the entire multilayer piezoelectric device of a first preferred embodiment of the present invention.
Figure 2:
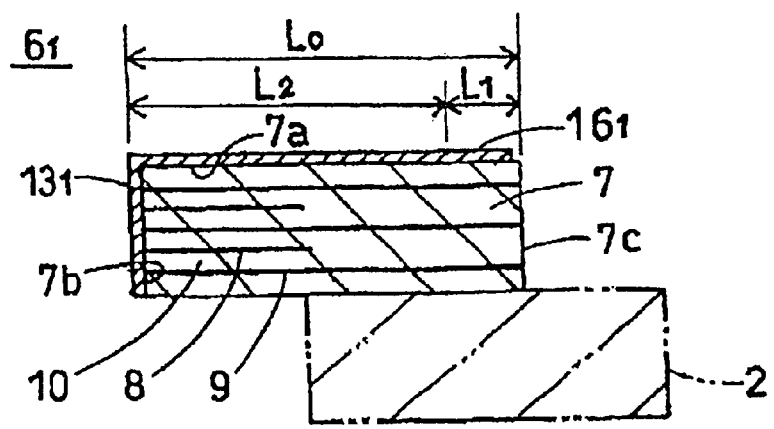
FIG. 2 is a sectional view taken along line A—A of FIG. 1.
Figure 9:
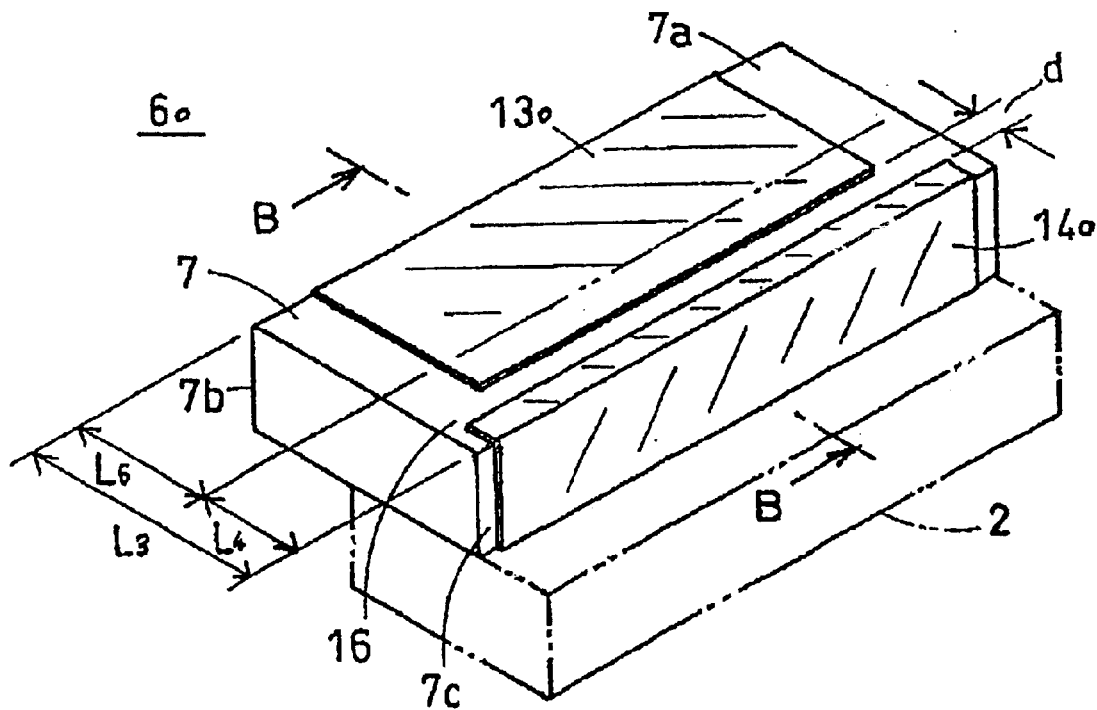
FIG. 9 is a perspective view of the entire related piezoelectric actuator when it is being used.
Figure 10:
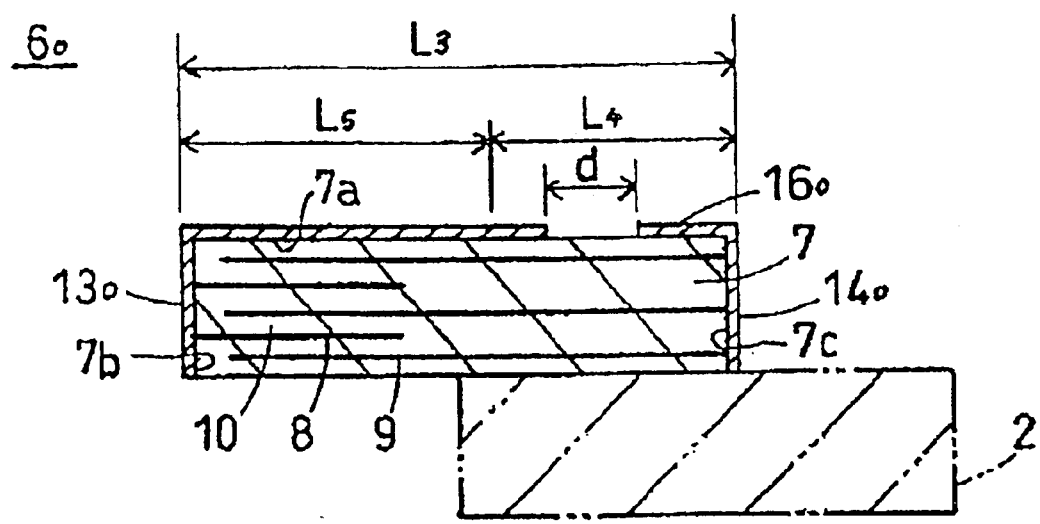
FIG. 10 is a sectional view taken along line B—B of FIG. 8.

FIG. 1 is a perspective view of the entire multilayer piezoelectric device of a first preferred embodiment of the present invention. FIG. 2 is a sectional view taken along line A—A of FIG. 1. Corresponding elements to those of the related multilayer piezoelectric device shown in FIGS. 9 and 10 are indicated by the same reference numerals.

More specifically, a multilayer piezoelectric device $6_1$ according to a first preferred embodiment includes a substantially rectangular piezoelectric substrate 7. Short internal electrodes 8 and long internal electrodes 9, having different lengths, are arranged so that the short internal electrodes 8 and the long internal electrodes 9 extend from a pair of opposing side surfaces 7b and 7c, towards the side surfaces opposite to the side surfaces from which the short internal electrodes 8 and the long internal electrodes 9 extend. In addition, the short internal electrodes 8 and the long internal electrodes 9 are arranged so as to be alternately stacked in the piezoelectric substrate 7. The side surfaces 7b and 7c are opposite each other in the direction of a short side of the piezoelectric substrate 7. Active portions 10 which are displaced in a direction that is substantially perpendicular to the lamination direction are located at the portions where the electrodes 8 and the corresponding electrodes 9 overlap. These structural features are the same as those of the related piezoelectric actuator $6_o$ shown in FIGS. 9 and 10.

A feature of the first preferred embodiment is that a first external electrode $13_1$ is electrically connected to the short internal electrodes 8 drawn out to the side surface 7b of the piezoelectric substrate 7 near the active portions 10, and that a pair of left and right second external electrodes $14_1$ and $14_1$ are electrically connected to the long internal electrodes 9 drawn out to the side surface 7c of the piezoelectric substrate 7 distant from the active portions 10. The first external electrode $13_1$ extends from the side surface 7b of the piezoelectric substrate 7 near the active portions 10 to a location adjacent to the side surface 7c distant from the active portions 10 by extending onto a main surface 7a. On the other hand, the second external electrodes $14_1$ and $14_1$ are arranged to extend from the side surface 7c onto the main surface 7a so as to be disposed on the left and right sides of locations at the first external electrode $13_1$ that are adjacent to the side surface 7c distant from the active portions 10.

Accordingly, in the first preferred embodiment, since the pair of second external electrodes $14_1$ and $14_1$ are disposed on the left and right sides of locations at the first external electrode $13_1$ that are adjacent to the side surface $7c$ distant from the active portions 10, it is possible to dispose the first external electrode $13_1$ and the second external electrodes $14_1$ and $14_1$ adjacent to the side surface $7c$ of the piezoelectric substrate 7 distant from the active portions 10. Therefore, for a predetermined soldering portion $16_1$ to which an FPC 4 is soldered when a piezoelectric actuator $1_1$ is constructed, an area extending only a slight distance $L_1$ from the side surface $7c$ of the piezoelectric substrate 7 distant from the active portions 10 needs to be formed, so that, unlike the related art device, it is not necessary to make this area extend a long distance from the side surface $7c$. In other words, the condition $L_1 \ll L_4$ is preferably satisfied. For example, in the related art device, $L_4$ needs to be about 2.6 mm, but, in the first preferred embodiment, $L_1$ is a sufficient value when it is equal to about 1.0 mm. Therefore, the length of the predetermined soldering portion $16_1$ in the direction of a short side thereof can be made considerably smaller. Therefore, even if an overall length $L_0$ of the piezoelectric substrate 7 in the direction of a short side is smaller than the overall length $L_3$ of the piezoelectric substrate 7 of the related example ($L_0 < L_3$), it is possible to sufficiently separate the predetermined soldering portion $16_1$ from locations of the active portions 10. As a result, it is possible to make the entire multilayer piezoelectric device of the present invention smaller than the entire related multilayer piezoelectric device.

Figure 11:
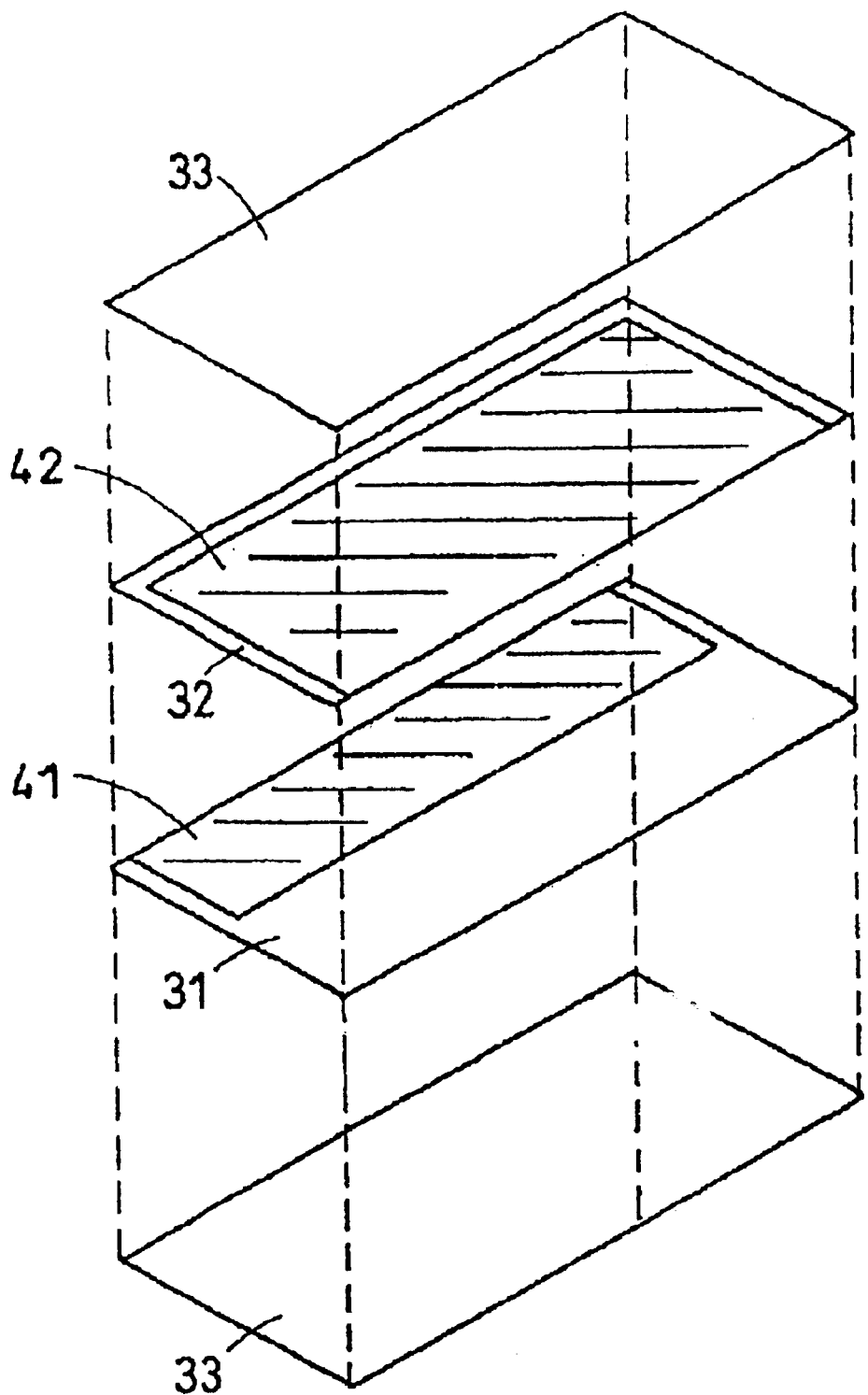
FIG. 11 is an exploded perspective view illustrating a process of producing the related multilayer piezoelectric device.
Figure 12:
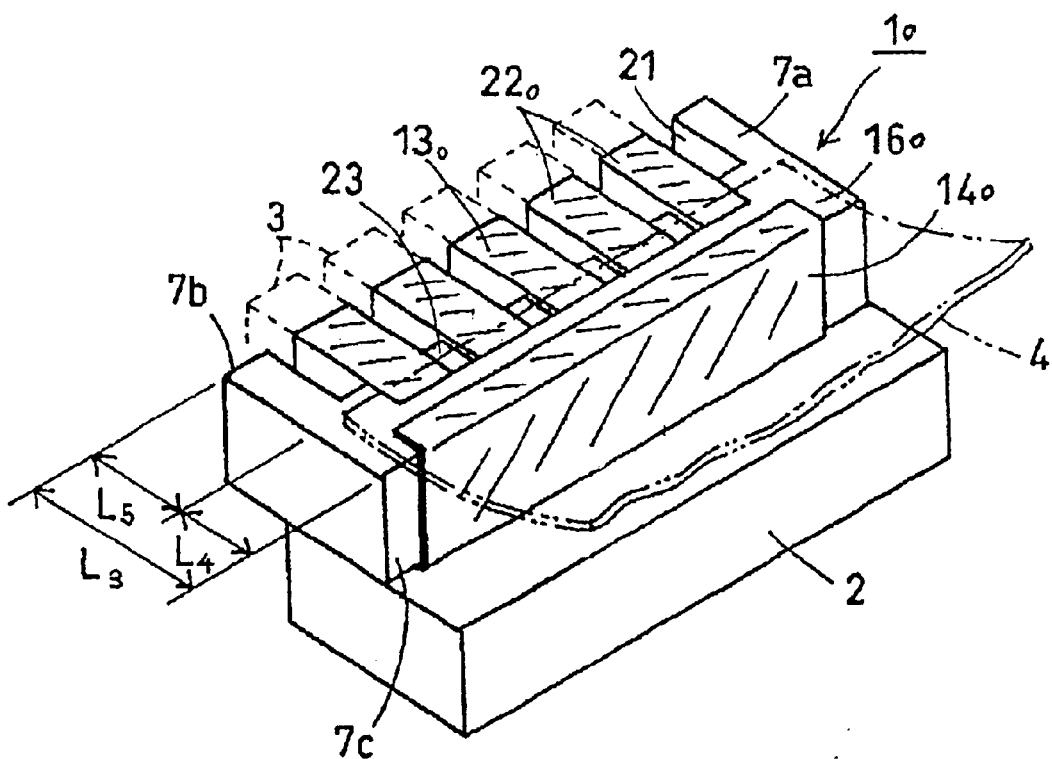
FIG. 12 is a perspective view of a piezoelectric actuator in which the related multilayer piezoelectric device is included.
Figure 13:
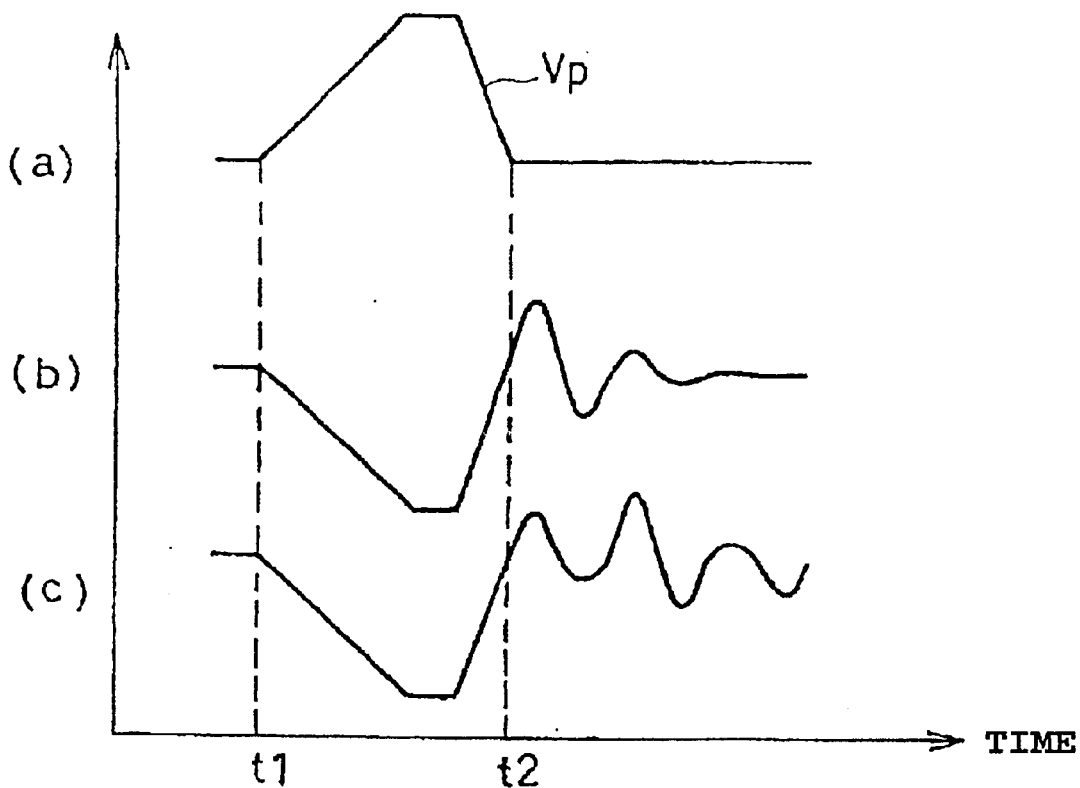
FIG. 13 is a timing chart showing vibration damping characteristics when a predetermined driving signal is applied to a movable portion of the piezoelectric actuator.

The multilayer piezoelectric device 61 is preferably produced basically by the same procedures as those that are conventionally carried out as shown in FIG. 11. Using the multilayer piezoelectric device $6_1$, the piezoelectric actuator 11 is preferably produced by the same procedures as those that are conventionally carried out.

Figure 3:
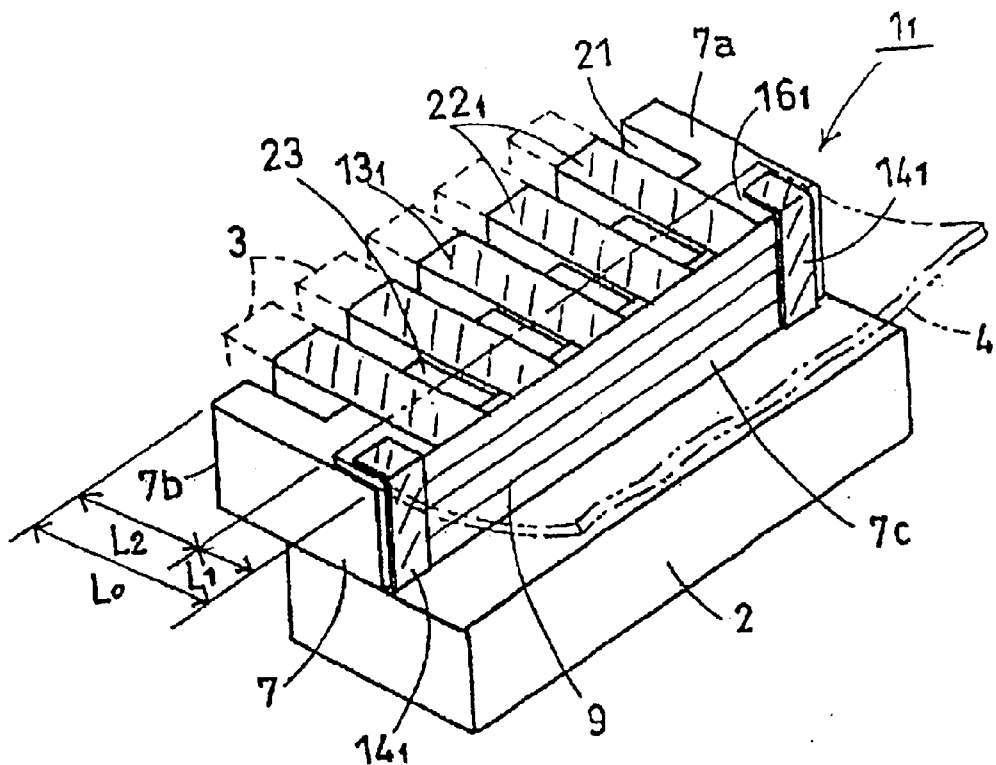
FIG. 3 is a perspective view of a piezoelectric actuator in which the multilayer piezoelectric device of the first preferred embodiment of the present invention is included.

Accordingly, as shown in FIG. 3, the piezoelectric actuator $1_1$ is produced by forming cuts in the active portions 10 along the longitudinal direction of the multilayer piezoelectric device $6_1$ at predetermined pitches from the side surface $7b$ near the active portions 10 towards the side surface $7c$ opposite to the side surface $7b$ in order to form extending slits 21. Movable portions $22_1$ that can be separately driven are formed between the corresponding slits 21. Shallow grooves 23 are formed consecutively with the corresponding slits 21. Electrical conductors on the FPC 4 are soldered to the predetermined soldering portion $16_1$ in order to electrically connect the electrical conductors on the FPC 4 to divided first external electrode $13_1$ portions and the second external electrodes $14_1$. Pressure-generating chambers 3 are separately disposed at the corresponding movable portions $22_1$ of the piezoelectric actuator $1_1$.

In the piezoelectric actuator $1_1$ having this structure, the FPC-soldering location is within an area that is situated at a slight distance $L_1$ from the side surface $7c$ of the piezoelectric substrate 7 distant from the active portions 10, and, thus, at a sufficient distance from the active portions 10. Therefore, the movable portions $22_1$ expand and contract smoothly, and transmission of vibration, produced by displacement of the movable portions $22_1$, to other portions through the FPC 4 is restricted. Therefore, vibration is damped within a short period of time, so that ink is stably discharged, thereby providing excellent image quality. In addition, since the soldering portion is disposed away from the active portions, there is no possibility of the polarization properties of the active portions being deteriorated by heat produced during soldering, so that stable piezoelectric properties are provided.

Although, in the first preferred embodiment, the first external electrode $13_1$ is electrically isolated from each movable portion $22_1$ by forming the shallow grooves 23 with respect to the first external electrode $13_1$, it is possible to form the first external electrode $13_1$ into a configuration which allows it to be electrically isolated at a predetermined pitch along the longitudinal direction of the piezoelectric substrate 7 by previously performing masking when the first external electrode $13_1$ is formed.

In the first preferred embodiment, signal-input-side electrical conductors on the FPC 4 and a ground-side electrical conductor are connected to the first external electrode $13_1$ and the second external electrodes $14_1$, respectively. However, the ground-side electrical conductor on the FPC 4 and the signal-input-side electrical conductors may be connected to the first external electrode $13_1$ and the second external electrodes $14_1$, respectively, without creating any functional problems.

Figure 4:
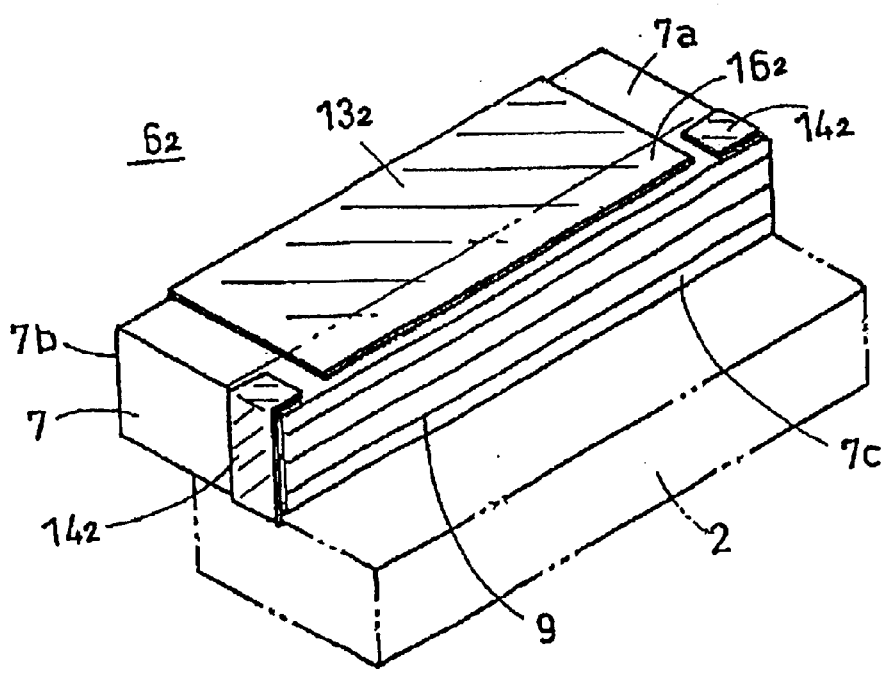
FIG. 4 is a perspective view of the entire multilayer piezoelectric device of a second preferred embodiment of the present invention.
Figure 5:
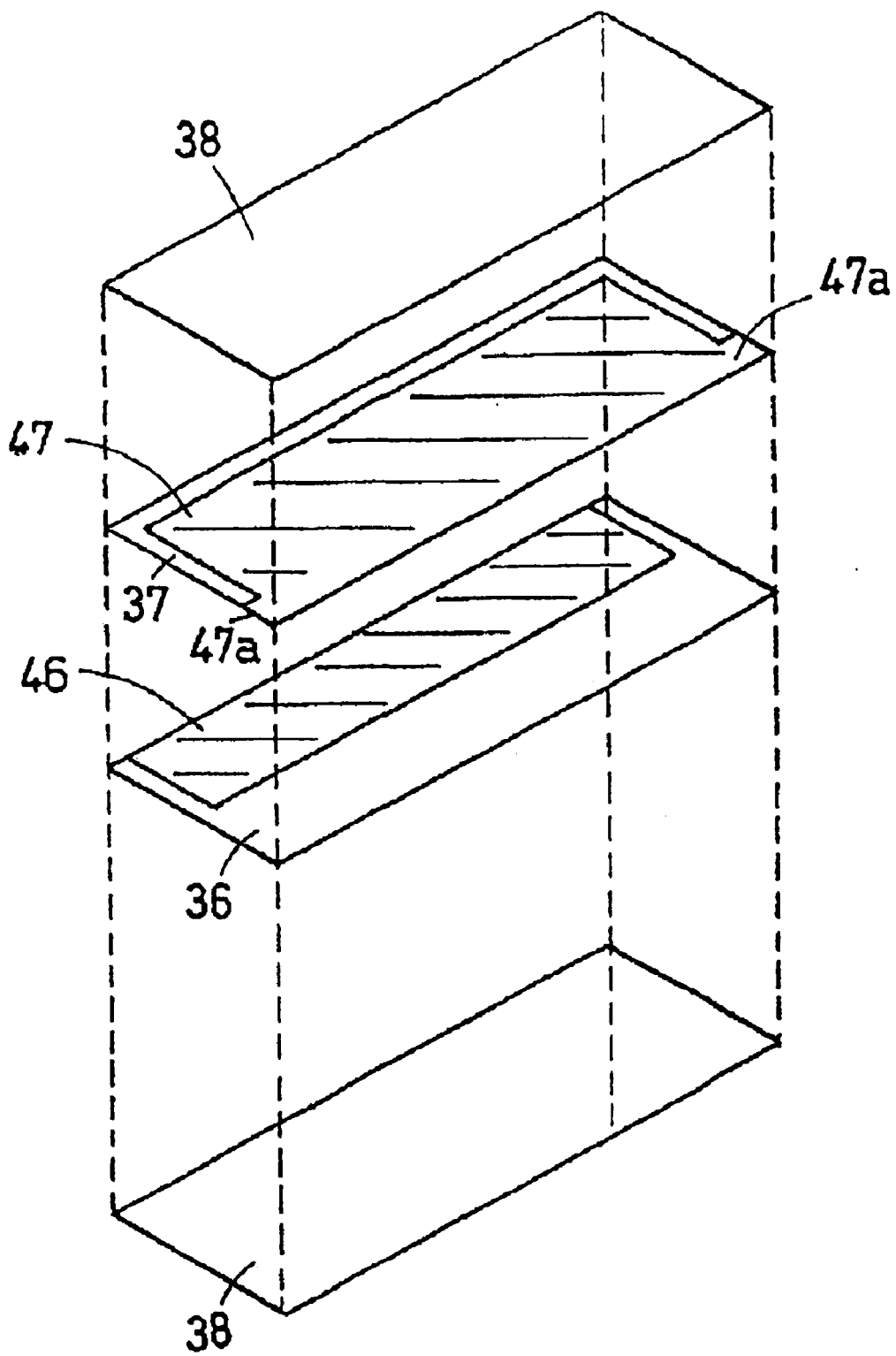
FIG. 5 is an exploded perspective view illustrating a process of producing the multilayer piezoelectric device of the second preferred embodiment of the present invention.

FIG. 4 is a perspective view of the entire multilayer piezoelectric device of a second preferred embodiment of the present invention. FIG. 5 is an exploded perspective view illustrating a process for producing the multilayer piezoelectric device of the second preferred embodiment of the present invention. Corresponding elements to those of the first preferred embodiment shown in FIGS. 1 and 2 are indicated by the same reference numerals.

A feature of a multilayer piezoelectric device 62 of the second preferred embodiment is that a pair of second external electrodes $14_2$ extend from corresponding short-side side surfaces $7d$ and $7e$ (which are substantially perpendicular to a side surface $7c$ of a piezoelectric substrate 7 distant from active portions) onto a main surface $7a$, and that the portions of the second external electrodes $14_2$ extending onto the main surface $7a$ are disposed on both the left and right sides of locations at a first external electrode $13_2$ that are adjacent to the side surface $7c$ distant from the active portions.

The other structural features are preferably the same as those of the first preferred embodiment, so they will not be described in detail below.

The multilayer piezoelectric device $6_2$ of the second preferred embodiment is produced as shown in FIG. 5. There are provided three types of green sheets, including green sheets 36 which have electrically conductive patterns 46, which define short internal electrodes 8, disposed thereon, green sheets 37 which have electrically conductive patterns 47, which define long internal electrodes 9, disposed thereon; and green sheets 38 which do not have any electrically conductive patterns disposed thereon. Then, procedures which are basically the same as those used in the first preferred embodiment are carried out. However, the electrically conductive patterns 47, which become the long internal electrodes 9, reach one of the long sides of the green sheet 37, so that they can be connected to the second external electrodes $14_2$. In addition, portions of the electrically conductive patterns 47 extend along the short sides of the green sheet 37 to define extending portions 47a. Even here, when, using the multilayer piezoelectric device $6_2$ produced in this way, the piezoelectric actuator is produced, the same procedures as those of the first preferred embodiment are carried out, so that these will not be described in detail below.

As in the first preferred embodiment, in the multilayer piezoelectric device $6_2$ of the second preferred embodiment, the first external electrode $13_2$ and the second external electrodes $14_2$ are adjacent to the side surface $7c$ of the piezoelectric substrate 7 distant from the active portions, so that it is possible to sufficiently separate a predetermined soldering portion $16_2$ from the locations of the active portions. Therefore, it is possible to make the entire multilayer piezoelectric device $6_2$ smaller than a related multilayer piezoelectric device. In addition, when the piezoelectric actuator is produced using the multilayer piezoelectric device $6_2$, the soldering location is sufficiently separated from the active portions 10, so that ink is stably discharged, thereby providing excellent image quality, and there is no possibility of the polarization properties of the active portions 10 being deteriorated by heat produced during soldering, so that stable piezoelectric properties are achieved.

In the first and second preferred embodiments, the desired multilayer piezoelectric devices $6_1$ and $6_2$ are produced preferably by preparing three types of green sheets 31, 32, and 33, and 36, 37, and 38, respectively, and by, after alternately and successively placing the corresponding green sheets upon each other, baking the resulting layered structure. However, a multilayer piezoelectric device may be produced in the following way.

Figure 6:
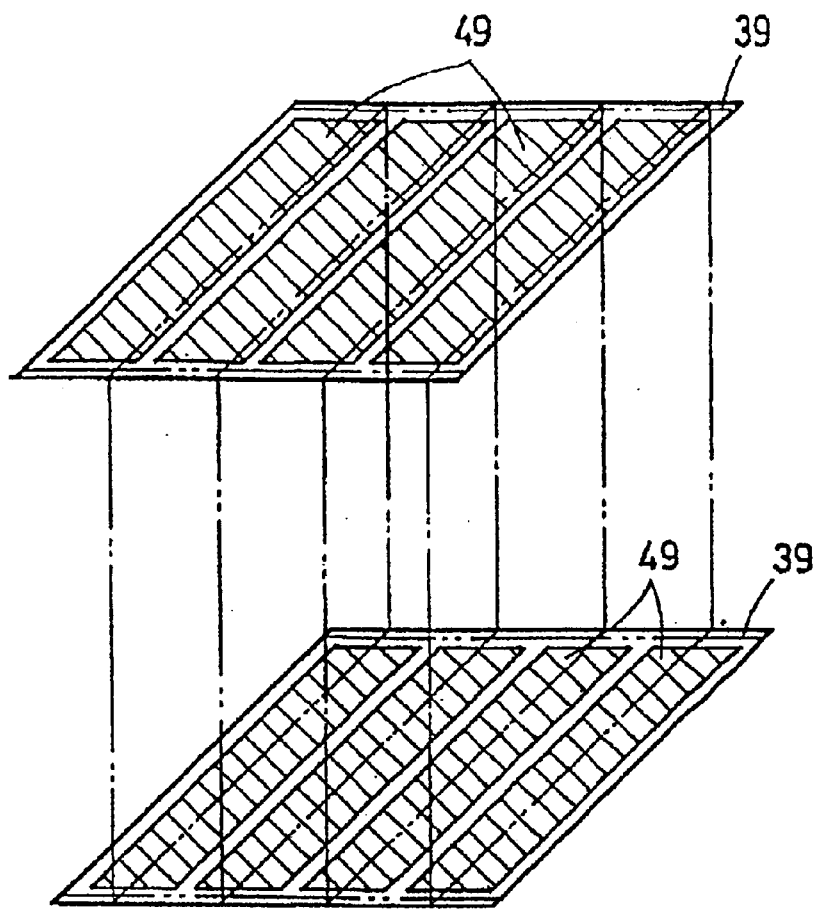
FIG. 6 is an exploded perspective view illustrating another process of producing a multilayer piezoelectric device according to preferred embodiments of the present invention.
Figure 7:
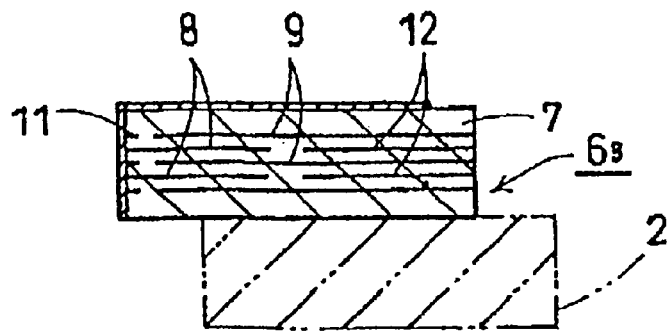
FIG. 7 is a vertical sectional view of the multilayer piezoelectric device formed by the production process shown in FIG. 6.
Figure 8:
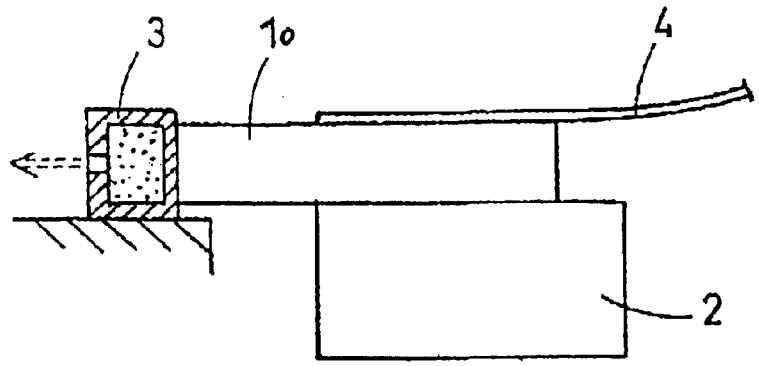
FIG. 8 is a sectional view showing a piezoelectric actuator when it is being used.

More specifically, as shown in FIG. 6, a plurality of one type of green sheets 39 having electrically conductive patterns 49 of the same shapes disposed thereon are prepared. The green sheets 39 are stacked upon each other so that they are alternately displaced from each other in the horizontal direction, and the resulting layered structure is subject to baking. Thereafter, by cutting along dotted lines shown in FIG. 6, a multilayer piezoelectric device 63 is produced. Accordingly, as shown in FIG. 7, in the multilayer piezoelectric device $6_3$ produced by this method, edges 11 and 12 remain after the cutting, in addition to short internal electrodes 8 and long internal electrodes 9, in a piezoelectric substrate 7. However, this is not a problem in terms of the property of the multilayer piezoelectric device $6_3$. Instead of placing the green sheets 39 having the electrically conductive patterns 49 of the same shapes upon each other so that they are alternately displaced in the horizontal direction from each other, electrically conductive patterns 49 may be formed on the green sheets 39 with the printing locations displaced from each other, and, then, the green sheets 39 may be placed upon each other without displacing them from each other in order to similarly produce a multilayer piezoelectric device such as the multilayer piezoelectric device 63 shown in FIG. 7.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A multilayer piezoelectric device comprising:
   a piezoelectric substrate;
   a plurality of longer internal electrodes;
   a plurality of shorter internal electrodes wherein the longer internal electrodes and the shorter internal electrodes have different lengths, are arranged so that the longer internal electrodes and the shorter internal electrodes extend from a pair of opposing side surfaces of the piezoelectric substrate towards the corresponding side surfaces of the piezoelectric substrate opposite to the side surfaces from which the longer internal electrodes and the shorter internal electrodes extend, and are arranged so that the shorter internal electrodes and the longer internal electrodes are alternately stacked inside the piezoelectric substrate;
   active portions disposed at locations where the longer internal electrodes and the corresponding shorter internal electrodes are stacked, the active portions being displaced in a direction that is substantially perpendicular to a direction in which the longer internal electrodes and the corresponding shorter internal electrodes are stacked;
   a first external electrode which is electrically connected to the shorter internal electrodes at one of the side surfaces of the piezoelectric substrate; and
   a second external electrode which is electrically connected to the longer internal electrodes at one of the side surfaces of the piezoelectric substrate;
   wherein the first external electrode and the second external electrode are separately disposed on a surface of the piezoelectric substrate; and
   the first external electrode extends from the side surface of the piezoelectric substrate near the active portions, extends onto a main surface of the piezoelectric substrate, and extends to a location adjacent to the side surface that is distant from the active portions where the longer internal electrodes are drawn out, and the second external electrode extends onto the main surface so as to be disposed on left and right sides of locations at the first external electrode that are adjacent to the side surface of the piezoelectric substrate that is distant from the active portions.

2. A multilayer piezoelectric device according to claim 1, wherein the piezoelectric substrate has a substantially rectangular shape.

3. A multilayer piezoelectric device according to claim 1, wherein the second external electrode is arranged so as to extend onto the main surface from the side surface of the piezoelectric substrate that is distant from the active portions.

4. A multilayer piezoelectric device according to claim 1, wherein the second external electrode is arranged so as to extend onto the main surface from a side surface of the piezoelectric substrate that is substantially perpendicular to the side surface of the piezoelectric substrate that is distant from the active portions.

5. A multilayer piezoelectric device according to claim 1, wherein the active portions include cuts formed therein to define slits.

6. A multilayer piezoelectric device according to claim 1, wherein the piezoelectric substrate vibrates in a direction that is substantially perpendicular to a thickness direction of the piezoelectric substrate.

7. A multilayer piezoelectric device according to claim 1, wherein the active portions vibrate in a direction that is substantially perpendicular to a thickness direction of the piezoelectric substrate.

8. A piezoelectric actuator comprising:
   a multilayer piezoelectric device including:
      a piezoelectric substrate;
      a plurality of longer internal electrodes;
      a plurality of shorter internal electrodes wherein the longer internal electrodes and the shorter internal electrodes have different lengths, are arranged so that the longer internal electrodes and the shorter internal electrodes extend from a pair of opposing side surfaces of the piezoelectric substrate towards the corresponding side surfaces of the piezoelectric substrate opposite to the side surfaces from which the longer internal electrodes and the shorter internal electrodes extend, and are arranged so that the shorter internal electrodes and the longer internal electrodes are alternately stacked inside the piezoelectric substrate;

active portions disposed at locations where the longer internal electrodes and the corresponding shorter internal electrodes are stacked, the active portions being displaced in a direction that is substantially perpendicular to a direction in which the longer internal electrodes and the corresponding shorter internal electrodes are stacked;

a first external electrode which is electrically connected to the shorter internal electrodes at one of the side surfaces of the piezoelectric substrate; and a second external electrode which is electrically connected to the longer internal electrodes at one of the side surfaces of the piezoelectric substrate;

wherein the first external electrode and the second external electrode are separately disposed on a surface of the piezoelectric substrate;

the first external electrode extends from the side surface of the piezoelectric substrate near the active portions, extends onto a main surface of the piezoelectric substrate, and extends to a location adjacent to the side surface that is distant from the active portions where the longer internal electrodes are drawn out, and the second external electrode extends onto the main surface so as to be disposed on left and right sides of locations at the first external electrode that are adjacent to the side surface of the piezoelectric substrate that is distant from the active portions; and slits are formed to extend from the side surface near the active portions towards the side surface opposite thereto, the slits being formed at a predetermined pitch along a direction that is substantially perpendicular to the direction of extension of the slits in order to provide separately drivable movable portions between the corresponding slits; and an electrical conductor on a flexible printed circuit board is connected to the first external electrode, divided by the slits, and the second external electrode.

9. A piezoelectric actuator according to claim 8, wherein the piezoelectric substrate has a substantially rectangular shape.

10. A piezoelectric actuator according to claim 8, wherein the second external electrode is arranged so as to extend onto the main surface from the side surface of the piezoelectric substrate that is distant from the active portions.

11. A piezoelectric actuator according to claim 8, wherein the second external electrode is arranged so as to extend onto the main surface from a side surface of the piezoelectric substrate that is substantially perpendicular to the side surface of the piezoelectric substrate that is distant from the active portions.

12. A piezoelectric actuator according to claim 8, wherein the slits are formed by cuts in the active portions.

13. A piezoelectric actuator according to claim 8, wherein the piezoelectric substrate vibrates in a direction that is substantially perpendicular to a thickness direction of the piezoelectric substrate.

14. A piezoelectric actuator according to claim 8, wherein the active portions vibrate in a direction that is substantially perpendicular to a thickness direction of the piezoelectric substrate.

* * * * *